US006188498B1

(12) United States Patent
Link et al.

(10) Patent No.: US 6,188,498 B1
(45) Date of Patent: Feb. 13, 2001

(54) LOCAL CONTROL FOR BURST MODE OPTICAL TRANSMITTERS

(75) Inventors: Garry N. Link, Aloha; Christopher G. Martinez, Portland, both of OR (US)

(73) Assignee: Maxim Integrated Products, Inc., Sunnyvale, CA (US)

(*) Notice: Under 35 U.S.C. 154(b), the term of this patent shall be extended for 0 days.

(21) Appl. No.: 09/116,028

(22) Filed: Jul. 15, 1998

(51) Int. Cl.[7] .......................... H04B 10/04; H04B 10/00; H01S 3/13
(52) U.S. Cl. .......................... 359/187; 359/158; 359/180; 359/186; 372/29.01; 372/31
(58) Field of Search .................................. 359/180, 187, 359/186, 158; 372/29, 30, 31, 32

(56) References Cited

U.S. PATENT DOCUMENTS

| | | | |
|---|---|---|---|
| 4,558,465 | * 12/1985 | Siegel et al. | 455/609 |
| 4,709,370 | 11/1987 | Bednarz et al. | 372/38 |
| 4,718,118 | 1/1988 | Viola | 455/613 |
| 4,833,680 | 5/1989 | Kaiser et al. | 372/29 |
| 4,853,934 | 8/1989 | Sakurai | 372/29 |
| 5,373,387 | 12/1994 | Bosch et al. | 359/187 |
| 5,502,298 | 3/1996 | Geller | 250/2.5 |
| 5,563,898 | 10/1996 | Ikeuchi et al. | 372/38 |
| 5,734,668 | 3/1998 | Raven et al. | 372/38 |
| 5,736,844 | 4/1998 | Yanagisawa | 323/282 |
| 5,742,133 | 4/1998 | Wilhelm et al. | 315/291 |

FOREIGN PATENT DOCUMENTS

| | | |
|---|---|---|
| 0 141 191 | 5/1985 | (EP) . |
| 0 664 591 | 7/1995 | (EP) . |
| WO 93/13577 | * 7/1993 | (WO) .............................. H04B/10/14 |

OTHER PUBLICATIONS

"A Versatile Si–Bipolar Driver Circuit with High Output Voltage Swing for External and Direct Laser Modulation in 10 Gb/s Optical–Fiber Links", Rein et al., IEEE Journal of Solid–State Circuits, vol. 29, No. 9, Sep. 1994, pp. 1014–1021.

"A Speed, Power, and Supply Noise Evaluation of ECL Driver circuits", Jouppi et al., IEEE Journal of Solid–State Circuits, vol. 31, No. 1, Jan. 1996, pp. 38–45.

Sony CXB1108AQ Laser Driver Data Sheet, pp. 140–145.

Sony CXB1118AQ/1128AQ Laser Driver Data Sheet, pp. 146–149.

Maxim MAX3261 Data Sheet, Rev. 3, Aug. 1996, pp. 1–12.

* cited by examiner

Primary Examiner—Leslie Pascal
Assistant Examiner—M. R. Sedighian
(74) Attorney, Agent, or Firm—Blakely, Sokoloff, Taylor & Zafman LLP

(57) ABSTRACT

The present invention is a method and apparatus for controlling a drive current of an optical transmitter having a laser. A sensing circuit generates a sensing signal responsive to an intensity of an optical radiation emitted by the laser. An error circuit is coupled to the sensing circuit to generate an error quantity in response to the sensing signal. An updating circuit is coupled to the error circuit to update a control quantity based on the error quantity synchronously with an input signal. The control quantity controls the drive current.

24 Claims, 4 Drawing Sheets

US 6,188,498 B1

LOCAL CONTROL FOR BURST MODE OPTICAL TRANSMITTERS

BACKGROUND OF THE INVENTION

1. Field of the Invention

This invention relates to optical transmitters. In particular, the invention relates to local control of optical transmitters.

2. Description of Related Art

Existing burst mode laser driver circuits use linear, wide dynamic range transimpedance amplifiers to monitor the optical signal of the laser. This transimpedance amplifier is used to either drive a precision (e.g., 10-bit) analog-to-digital converter or independent comparator circuits to determine the optical levels of the transmitted signal. Existing solutions are implemented with several integrated circuits.

One prior art solution is to use a microprocessor to control the output current sources that drive the semiconductor laser. A photodiode measures the optical radiation emitted by the laser and produces current proportional to the intensity of the optical radiation. This photodiode current is then converted to an analog voltage by a transimpedance amplifier. An analog-to-digital converter (ADC) converts this analog voltage into a digital data representing the photodiode current. The microprocessor reads this digital data and compares the measured photodiode current with the desired values. Based on the result of this comparison, the microprocessor calculates an appropriate control value. The microprocessor then outputs the control value to the current sources to set the driving currents to match the desired values. The process is continuously repeated to keep the output current within the desired operating range. The disadvantages of this technique include the hardware complexity (e.g., the ADC and the microprocessor) and the difficulty to maintain the precise timing of the control.

Another prior art technique uses peak detectors, analog comparators and counters to individually control the current sources. Two branches of circuit are used. The first branch includes a negative peak detector, a first analog comparator, and a counter to control the first current source. The second branch includes a positive peak detector, a second analog comparator, and a second counter to control the second current source. Each of the analog comparators is compared with a suitable threshold value and produces an error value to control the amount and direction of the control quantity by incrementing or decrementing the corresponding counter. The two counters are clocked by two separate clock signals. Although this technique eliminates the ADC and the microprocessor, it still requires two peak detectors and two comparators. In addition, an additional clock generator circuit is required to generate clock signals to the counters.

The disadvantages of the prior art techniques include the hardware complexity which makes it difficult to implement the circuit on a single integrated circuit. In addition, the prior art techniques do not provide precise timing control. This may become a problem when burst data communications are involved because of the short duty cycle of the burst.

Therefore there is a need in the technology to provide an efficient method and apparatus to control the optical transmitter with less hardware and more precise timing.

SUMMARY OF THE INVENTION

The present invention is a method and apparatus for controlling a drive current of an optical transmitter having a laser. A sensing circuit generates a sensing signal responsive to an intensity of an optical radiation emitted by the laser. An error circuit is coupled to the sensing circuit to generate an error quantity in response to the sensing signal. An updating circuit is coupled to the error circuit to update a control quantity based on the error quantity synchronously with an input signal. The control quantity controls the drive current.

In a preferred embodiment, the sensing signal is generated synchronously with the input signal to produce the first sensing signal when the input signal is at a first state and the second sensing signal when the input signal is at a second state. The first sensing signal is produced by a photodiode current and a reference bias current which is generated by a reference bias current source. The second sensing signal is produced by the photodiode current, the reference bias current, and a reference modulating current which is generated by a reference modulating current source.

BRIEF DESCRIPTION OF THE DRAWINGS

The features and advantages of the present invention will become apparent from the following detailed description of the present invention in which.

DESCRIPTION OF THE PRESENT INVENTION

The present invention is a method and apparatus for local control of burst mode optical transmitters. The control circuit uses two separate counters to control two drive current sources for the laser. In one embodiment, the control circuit uses the input signal to clock two counters having opposite edge triggers. In another embodiment, the control circuit uses the input signal to switch the monitor currents synchronously with the drive current sources. The present invention reduces the hardware complexity and provides precise timing control.

Figure 1:
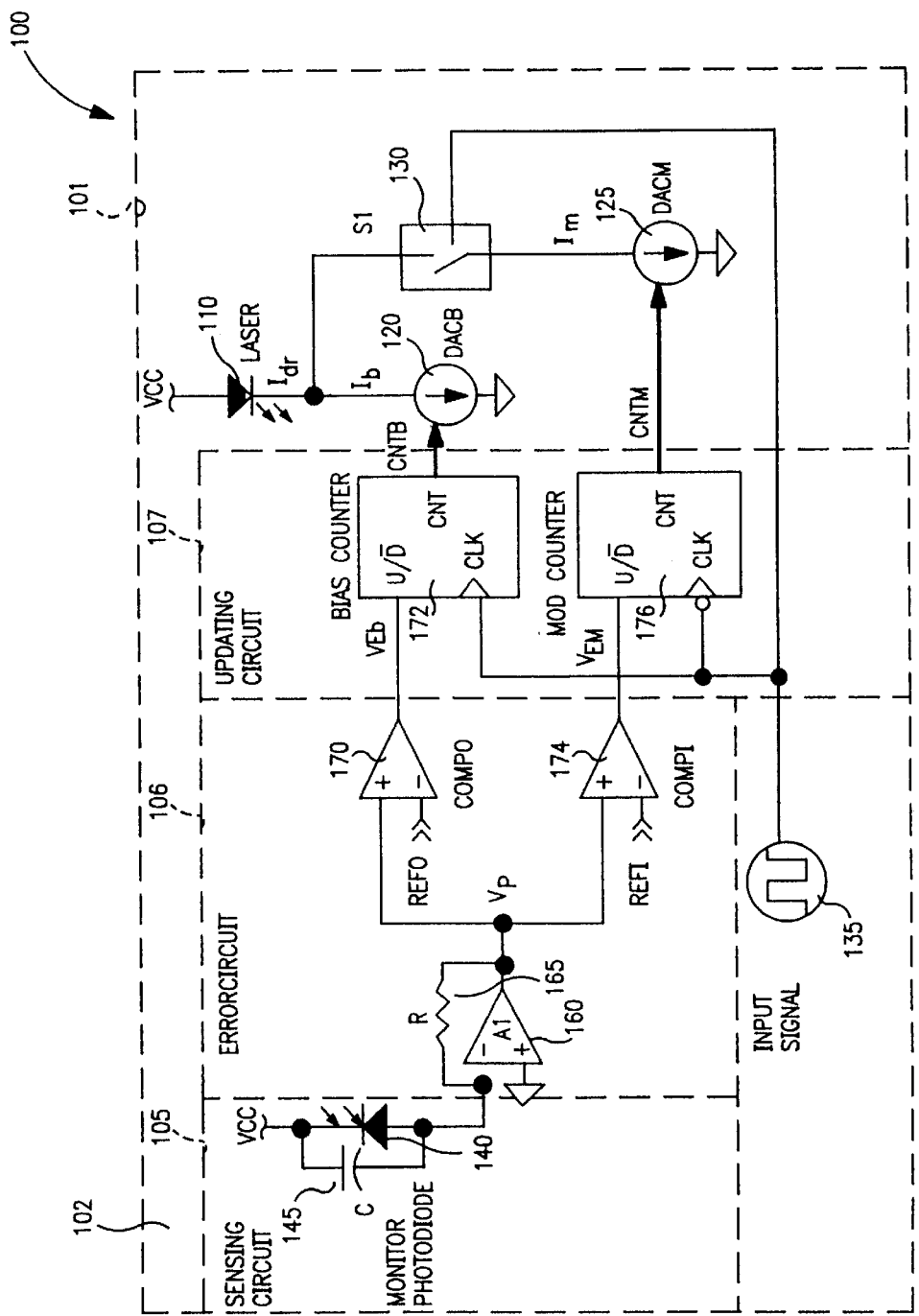
FIG. 1 is a diagram illustrating an optical transmitter system which may utilize a control circuit according to one embodiment of the invention.

FIG. 1 is a diagram illustrating an optical transmitter system which may utilize a control circuit according to one embodiment of the invention. The optical transmitter system 100 includes a laser drive circuit 101 and a control circuit 102.

The laser drive circuit 101 includes a laser 110, a current source DACB 120, a current source DACM 125, and a switch S1 130. The laser 110 is a semiconductor laser diode that emits optical radiation in response to a drive current $I_{dr}$. The drive current $I_{dr}$ includes a bias current $I_b$ and a modulating current $I_m$. The current source DACB 120 provides the bias current $I_b$ and the current source DACM 125 provides the modulating current $I_m$. In one embodiment, each of the current sources is a current mode digital-to-analog converter (DAC). The current mode DAC receives digital data and converts this digital data into a corresponding current. Controlling the drive current $I_{dr}$ therefore includes providing proper digital data to each of the current sources DACB 120 and DACM 125.

The switch S1 130 controls the modulation of the drive current. When the switch S1 is open, the current source DACM 125 is disconnected from the current source DACB 120. The drive current $I_{dr}$ therefore is equal to the current provided by the current source DACB 120 only, namely, the bias current $I_b$. This drive current $I_{dr}=I_b$ corresponds to a low output level. When the switch S1 130 is closed, the current source DACM 125 is connected to the current source DACB 120. The drive current therefore is equal to the sum of the currents provided by the current sources DACB 120 and DACM 125, namely, $I_b+I_m$. This sum current corresponds to a high output level. When the switch S1 130 is controlled by the input signal 135, the switching of the switch S1 is synchronized with the low and high levels of the input signal 135 to produce a suitable drive current. When the input signal 135 is low, the switch S1 130 is open, corresponding to the low output level. When the input signal 135 is high, the switch S1 130 is closed, corresponding to the high output level.

The control circuit 102 measures the intensity of the optical radiation emitted by the laser 110 and generates control digital data to the current sources DACB 120 and DACM 125. The control circuit 102 includes a sensing circuit 105, an error circuit 106, and an updating circuit 107. The sensing circuit includes a monitor photodiode 140 and a capacitor 145. The error circuit 106 includes a transimpedance amplifier 160, a feedback resistor R 165, an analog comparator COMP0 170 and an analog comparator COMP1 174. The updating circuit includes a bias counter 172 and a modulation counter 176.

The monitor photodiode 140 senses the intensity of the optical radiation emitted by the laser 110 and generates a photodiode current proportional to the radiation intensity. The capacitor C 145 indicates stray capacitance associated with the photodiode 140. The transimpedance amplifier 160 and the feedback resistor R 165 forms a current-to-voltage amplifier to produce a voltage $V_P$ corresponding to the filtered photodiode current. The voltage $V_P$ therefore is also proportional to the light intensity as radiated by the laser 110. The voltage $V_P$ then is applied to the comparator circuit comprising the two analog comparators COMP0 170 and COMP1 174.

The analog comparator COMP0 170 compares the voltage $V_P$ with a bias reference voltage REF0 and generates a bias error voltage $V_{Eb}$. The bias counter 172 is a counter that can count up (or increment) and count down (or decrement). The bias counter 172 has an up/down (U/D#) control input and a clock (CLK) input. When the U/D# input is at a low level, the bias counter 172 counts down, i.e., decrements. When the U/D# input is at a high level, the bias counter 172 counts up, i.e., increments. The bias counter 172 is clocked by a positive-going clock signal, i.e., the counting takes place at the positive-going transition of the clock signal. The bias counter 172 generates a bias digital count (CNTB) output. The CNTB output is a bias control quantity which is applied to the digital input of the current source DACB 120 to control the generation of the bias current $I_b$.

The analog comparator COMP1 174 compares the voltage $V_P$ with a modulation reference voltage REF1 and generates a modulation error voltage VEm. The modulation (MOD) counter 176 is essentially the same as the bias counter 172 except that the MOD counter 176 is negative-edge triggered, i.e., the counting takes place at the negative-going transition of the clock signal. The modulation counter 176 generates a modulating digital count (CNTM) output. The CNTM output is a modulating control quantity which is applied to the digital input of the current mode DACM 125 to control the generation of the modulating current $I_m$.

The current-to-voltage amplifier and the two comparators 170 and 174 form the error circuit 106 to produce the error quantity to be used to update the corresponding control quantity as represented by the digital count output at the corresponding counter. The number of bits of the counters 172 and 176 are predetermined and depends on the granularity of the control of the laser drive current. In one embodiment, the counters 172 and 176 are 8-bit up/down counters providing 256 counting values from 0 to 255.

The clock signals of the two counters 172 and 176 are tied together and connected to the input signal 135. Therefore the same input signal 135 is used to clock the two counters 172 and 176, at different clock edges, and to control the switch S1 130 in the output drive circuit 101.

When the intensity of the optical radiation emitted by the laser 110 in the laser drive circuit 101 is low, the monitor photodiode 140 generates a photodiode current with low magnitude. The transimpedance amplifier 160 converts the low current into a voltage $V_P$ at a high level due to its inverting nature. The analog comparator COMP0 compares the $V_P$ voltage with the REF0 voltage and produces an error voltage $V_{Eb}$ with a high level to put the bias counter 172 in the upcounting mode. The error voltage $V_{Eb}$ becomes valid after a propagation delay $\Delta_{Tb}$ after the switch S1 opens. This propagation delay is sufficiently long enough to hold the comparator COMP0 output stable before the positive-going edge of the counter clock signal (or the input signal). At the positive-going transition of the input signal 135, the counter 172 is updated to increment by one. The bias current $I_b$ increases by an amount equivalent to one least significant bit (LSB) of the digital data. This increase in the bias current increases the optical radiation of the laser 110.

After the positive-going transition, the input signal 135 reaches its stable high level, closing the switch S1, the drive current $I_{dr}$ is the sum of the currently updated bias current $I_b$ and the previously updated modulating current $I_m$. The $I_{dr}$ will become valid after some small delay $\Delta_{Tdr1}$ caused by the current source DACB 120. Since the bias current $I_b$ is increased, the drive current $I_{dr}$ is also increased by a corresponding amount. Therefore, a decrease in the optical radiation results in an increase in the bias current $I_b$ and the drive current $I_{dr}$. Similarly, an increase in the optical radiation results in a decrease in the bias current $I_b$ and the drive current $I_{dr}$.

The control of the current source DACM 125 operates in a similar manner. The analog comparator COMP1 174 compares the voltage $V_P$ with a reference voltage REF1. A low optical radiation results in a high error voltage $V_{Em}$ which increments the mod counter 176 by one at the negative-going transition of the input signal 135. The error voltage $V_{Em}$ becomes valid after a propagation delay $\Delta_{Tm1}$ caused by the combined delays of the photodiode current, the transimpedance amplifier 160, and the analog comparator 174. Again, this $\Delta_{Tm}$ delay is sufficiently long enough to hold the output of the comparator, or the error voltage $V_{Em}$ stable for the next update of the mod counter 176.

After the negative-going transition, the input signal 135 reaches its low level, the current source DACM 125 is disconnected from the laser 110, and the drive current $I_{dr}$ is equal to the previously updated bias current $I_b$ after a small delay $\Delta_{Tdr2}$. The currently updated mod current $I_m$ will be used to contribute to the drive current $I_{dr}$ when the input signal 135 transitions to a high level. In a similar fashion, when the optical radiation is high, the error voltage $V_{Em}$ is low, resulting in a decrease in the mod current $I_m$. The drive current $I_{dr}$ therefore is updated and controlled according to the intensity of the optical radiation emitted by the laser 110.

Figure 2:
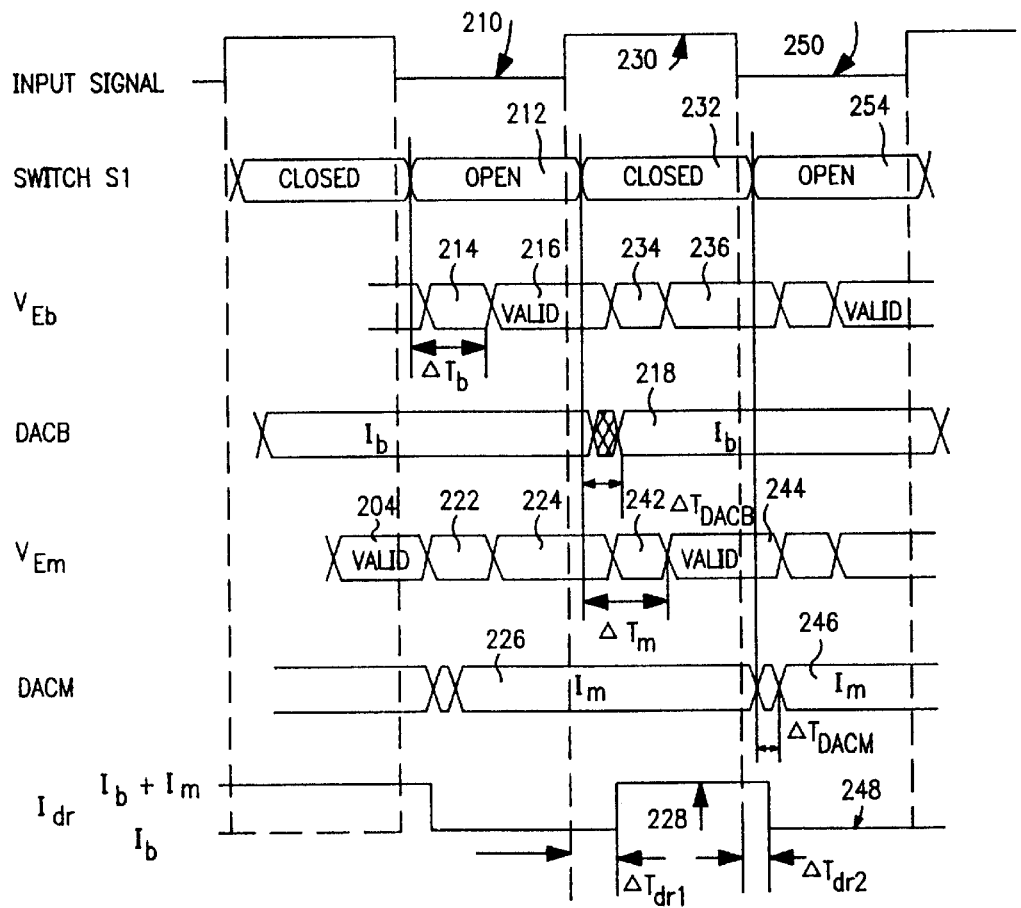
FIG. 2 is a timing diagram for the control circuit in FIG. 1 according to one embodiment of the invention.

FIG. 2 is a timing diagram for the control circuit in FIG. 1 according to one embodiment of the invention. The timing diagram shows the waveforms for the input signal, the switch S1, the bias error voltage $V_{Eb}$, the modulating error voltage $V_{Em}$, and the drive current $I_{dr}$.

A low level of the input signal in the interval 210 causes the switch S1 to open in the interval 212. A delay $\Delta T_b$, indicated by the interval 214, is caused by the combined delays from the photodiode 140, the transimpedance amplifier 160, and the analog comparator COMP0 170. After the delay $\Delta T_b$, the bias error voltage $V_{Eb}$ becomes valid in the interval 216. This delay is sufficiently long to keep the $V_{Eb}$ valid before the positive-going transition of the input signal to meet the set up time of the bias counter 172. The bias counter 172 is updated and the current source DACB 120 generates the bias current $I_b$ in the interval 218 after a delay $\Delta_{TDACB}$ caused by the current source DACB 120. Since the switch S1 is closed, the drive current $I_{dr}$ is the sum of the bias current $I_b$ (in the interval 218) and the mod current $I_m$ (in the interval 226). The mod current $I_m$ in the interval 226 is the result of the update of the modulating error voltage $V_{Em}$ at the previous negative-going transition.

During this time the input signal 135 is in the interval 230 causing the switch S1 closed in the interval 232. The photodiode 140 and the transimpedance amplifier 160 continue their operation but their propagation through the analog comparator COMP0 170 is irrelevant for the bias counter 172 because the error voltage $V_{Eb}$ is only valid for updating when the switch S1 is open. However, the operation of the photodiode and the transimpedance amplifier in this interval is relevant for the update of the mod counter 176. The modulating error voltage $V_{Em}$ is generated after the delay $\Delta_{Tm}$ in the interval 242. The delay $\Delta_{Tm}$ is caused by the combined delays from the photodiode 140, the transimpedance amplifier 160, and the analog comparator COMP1 174. After the delay $\Delta_{Tm}$ in the interval 242, the modulating error voltage $V_{Em}$ is valid in the interval 244. Again the delay $\Delta_{Tm}$ is sufficiently long enough to keep the modulating error voltage $V_{Em}$ valid before the negative-going transition of the input signal 135 to meet the set-up time of the mod counter 176. After the negative-going transition of the input signal 135, the mod counter 176 updates its count output. The current source DACM 125 produces an updated modulating current $I_m$ in the interval 246. At this time, the input signal 135 reaches its low level in the interval 250 causing the switch S1 open in the interval 254. The drive current $I_{dr}$ is equal to the bias current $I_b$ as generated by the DACB 120 in the interval 218 after a small delay $\Delta_{Tdr2}$. The process is then repeated.

By using the input signal 135 as a common clock signal for the bias counter 172 and the mod counter 176, the laser drive circuit 101 is controlled at precisely controlled times. The updating of the counters is synchronized with the switching of the drive current with a finite delay. The control circuit 101, therefore, generates proper control without using a separate clock generator circuitry for the clocking of the two counters. Furthermore, the control circuit 101 eliminates the use of two separate peak detectors.

Figure 3:
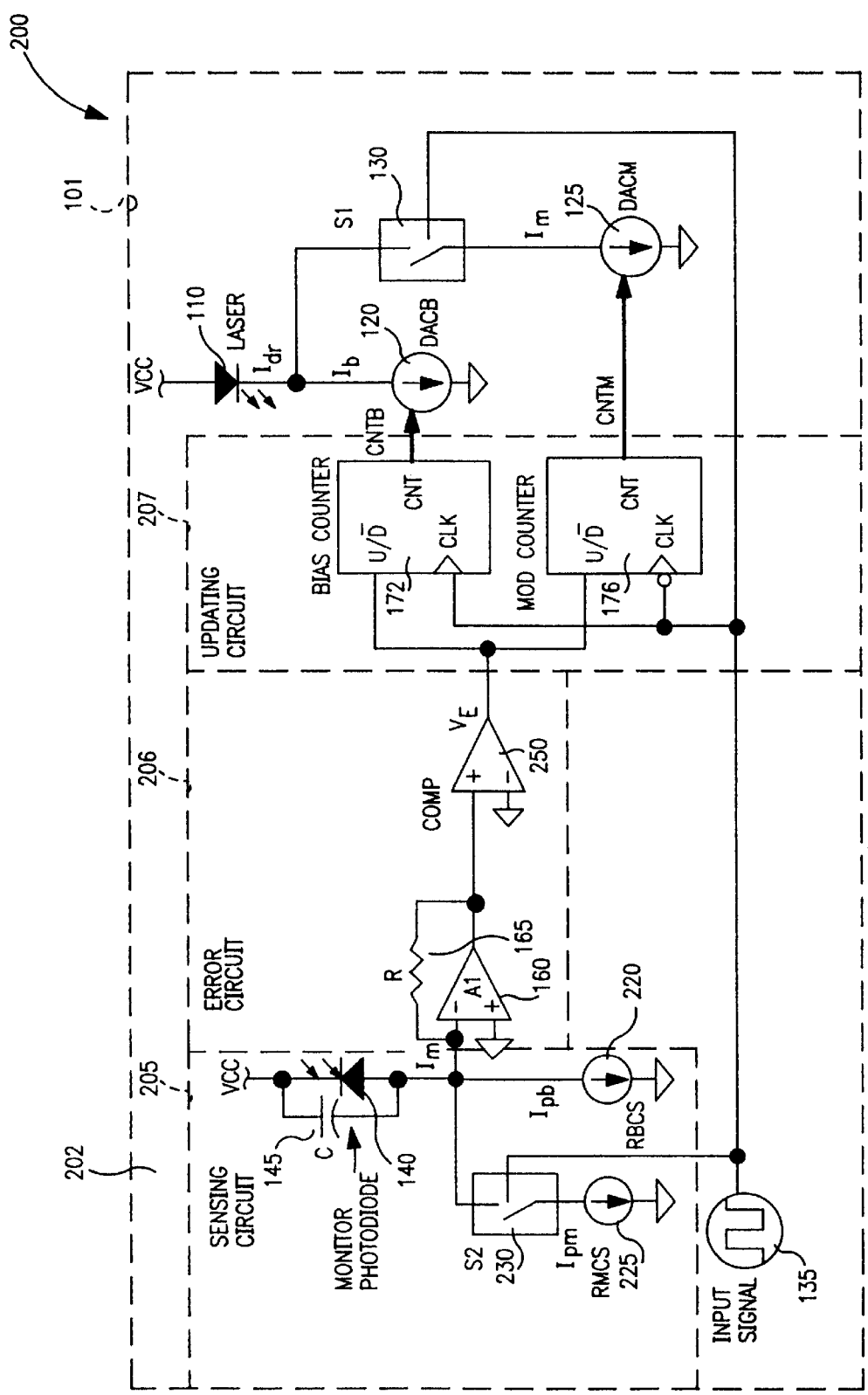
FIG. 3 is a diagram illustrating an optical transmitter system which may utilize a control circuit using synchronous switching according to one embodiment of the invention.

FIG. 3 is a diagram illustrating an optical transmitter system 200 which may utilize a control circuit using synchronous switching according to one embodiment of the invention. The optical transmitter system 200 includes the laser drive circuit 101 and a control circuit 202.

The laser drive circuit 101 is the same as in the optical transmitter system 100 in FIG. 1. The control circuit 202, however, operates differently using a synchronous switching method. The control circuit 202 includes a sensing circuit 205, an error circuit 206, and an updating circuit 207. The sensing circuit 205 includes the monitor photodiode 140, the capacitor 145, a switch S2 230, a reference bias current source RBCS 220, and a reference modulating current source RMCS 225. The error circuit 206 includes the transimpedance amplifier 160, the feedback resistor R 165, and an analog comparator COMP 250. The updating circuit 207 includes the bias counter 172 and the modulating counter 176.

The photodiode 140, the capacitor 145, the transimpedance amplifier 160, the feedback resistor R 165, the bias counter 172, and the modulating counter 176 essentially operate in the same manner as in the control circuit 101 in FIG. 1.

The switch S2 230 is controlled by the input signal 135. In other words, the input signal 135 now drives the switch S2, the bias counter 172, the modulating counter 176, and the switch S1 altogether. This scheme therefore assures synchronous operation of the entire system. The reference bias current source RBCS 220 provides a fixed current source $I_{Pb}$ to the transimpedance amplifier 160 in the bias mode, i.e., when both switches S2 and S2 are open. The reference modulating current source RMCS 225 is connected to the switch S1 to provide a fixed modulating current $I_{Pm}$ in the modulating mode, i.e., when both switches S1 130 and S2 230 are closed. The analog comparator COMP 250 compares the $V_P$ voltage with a fixed reference voltage to produce the error voltage $V_E$. The two counters 172 and 176 uses this error voltage $V_E$ to update their count, at different clock edges. The outputs of these counters are used to control the current source DACB 120 and DACM 125 as in FIG. 1.

The synchronous operation of the control circuit 202 in FIG. 3 differs than that of the control circuit 102 in FIG. 1 in that the error voltage $V_E$ in the control circuit 202 is changed synchronously with the switching of the switch S1 and the updating of the two counters 172 and 176. Therefore, although both counters 172 and 174 are connected to the same error voltage, each counter is updated with different values of the error voltage $V_E$. The result is that only one analog comparator COMP 250 is used instead of two analog comparators 170 and 174 as in the control circuit 101 in FIG. 1. Furthermore, this analog comparator COMP 250 is a simple comparator compared to the two comparators 170 and 174 because no precision matching is required. The additional switch S2 230 and the two reference current sources RBCS 220 and RMCS 225 can be implemented by simple hardware. The transimpedance amplifier 160 and the analog comparator COMP 250 form the error circuit 206 to generate the error quantity $V_E$ to be used to update a control quantity as represented by the digital count output at each counter.

When the input signal 135 is at a low level, switches S1 130 and S2 230 are open. The drive current $I_{dr}$ is equal to the bias current $I_b$. At the input side. the input current $I_{TA}$ to the transimpedance amplifier 160 is equal to the sum of the photodiode current and the reference bias current $I_{Pb}$. The input current $I_{TA}$ is converted to the $V_P$ voltage by the transimpedance amplifier 160. Since the reference bias current $I_{Pb}$ is fixed, the voltage $V_P$ is still proportional to the photodiode current which in turn is proportional to the optical radiation emitted by the laser 110. In effect, the REF0 voltage level in the control circuit 101 in FIG. 1 is moved to the monitor photodiode side to the bias reference current source RBCS 220. The analog comparator COMP 250 compares the $V_P$ voltage with a fixed voltage and produces the error voltage $V_E$ which controls the update of the bias counter 172. When the input signal 135 transitions from a low level to a high level, the bias counter 172 is updated (i.e., increments or decrements) according to the value of the $V_E$. The current source DACB 120 is therefore controlled accordingly.

When the input signal 135 is at a high level, both switches S1 130 and S2 230 are closed. The drive current $I_{dr}$ is equal to the sum $I_b+I_m$. The reference modulating current source RMCS 225 is connected to the input of the transimpedance amplifier 160. The input of the transimpedance amplifier 160 is now equal to the sum of the photodiode current, the reference bias current $I_{Pb}$, and the reference modulating current $I_{Pm}$. The transimpedance amplifier 160 converts this input current $I_{TA}$ into the voltage $V_P$. Since $I_{Pb}$ and $I_{Pm}$ are fixed, the voltage $V_P$ is proportional to the photodiode current which in turns is proportional to the optical radiation emitted by the laser 110. In effect, the voltage reference REF1 in the control circuit 102 in FIG. 1 is moved to the photodiode side to the reference bias and modulating current sources RBCS and RMCS. The analog comparator COMP 250 compares the $V_P$ voltage with a fixed voltage as before and produces the error voltage $V_E$. The error voltage $V_E$ now corresponds to the photodiode current and the reference bias and modulating currents $I_{Pb}$ and $I_{Pm}$. When the input signal 135 transitions from the high level to the low level, the modulating counter 176 is updated according to the error voltage $V_E$. The current source DACM 125 is then controlled by the mod counter 176 as before.

It is seen that the error voltage $V_E$ changes synchronously with the updating of the two counters 172 and 176. This is achieved by switching the reference current sources at the photodiode side synchronously with the input signal.

Figure 4:
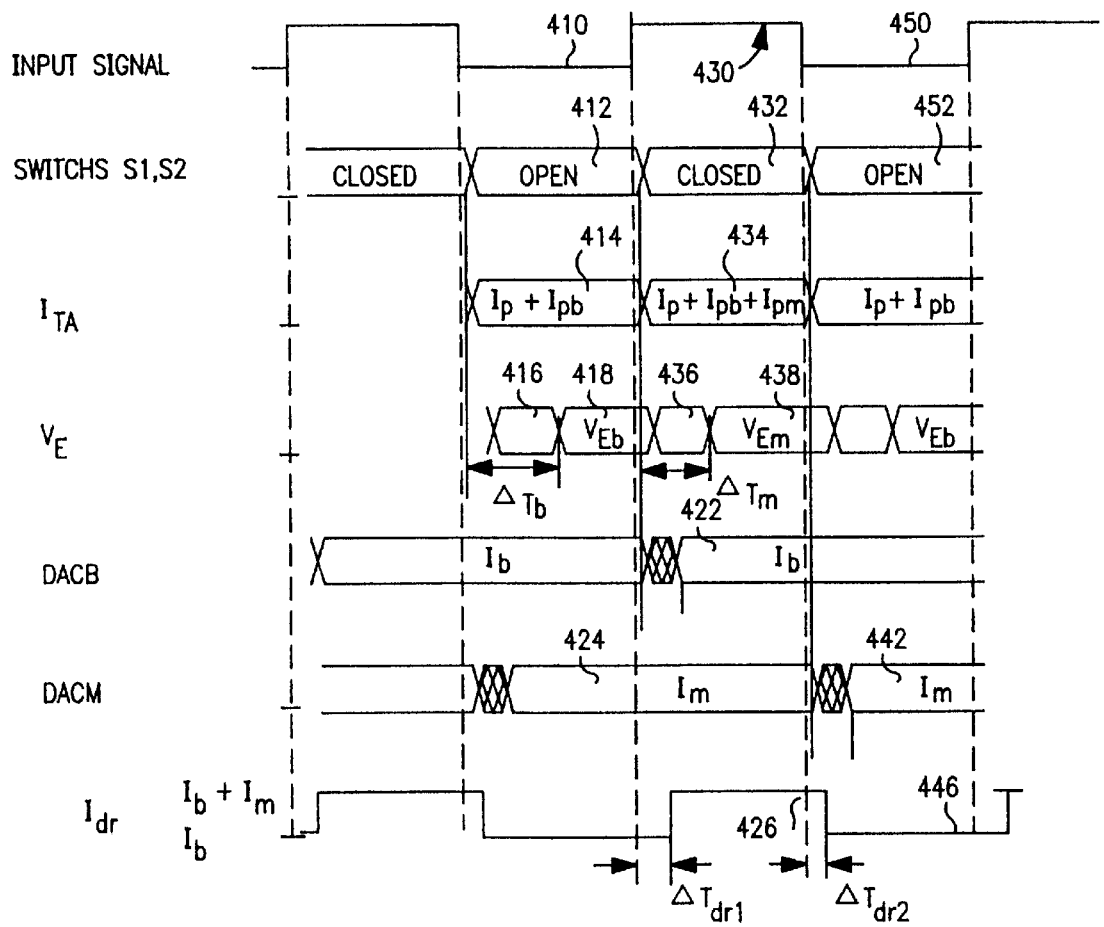
FIG. 4 is a timing diagram for the synchronous control circuit in FIG. 3 according to one embodiment of the invention.

FIG. 4 is a timing diagram for the synchronous control circuit in FIG. 3 according to one embodiment of the invention. The timing diagram shows the waveforms for the input signal, the switches S1 and S2, the transimpedance amplifier input current $I_{TA}$, the error voltage VE, the bias current source DACB, the modulating current source DACM, and the drive current $I_{dr}$.

A low level of the input signal 135 in the interval 410 causes the switches S1 and S2 to open in the interval 412. The $I_{TA}$ current is equal to the sum of the photodiode current $I_P$ and the reference bias current $I_{Pb}$ in the interval 414. A delay $I_{Tb}$, indicated by the interval 416, is caused by the combined delays from the photodiode 140, the transimpedance amplifier 160, and the analog comparator COMP 250. After the delay $\Delta_{Tb}$, the error voltage $V_E$ has the value of a bias error voltage $V_{Eb}$ in the interval 418. This delay is sufficiently long to keep the $V_{Eb}$ valid before the positive-going transition of the input signal to meet the set up time of the bias counter 172. The bias counter 172 is updated to produce a control quantity which is applied to the input of the current source DACB 120. The current source DACB 120 generates the bias current in the interval after a delay $\Delta_{TDACB}$ caused by the current source DACB 120.

After the positive-going transition, the input signal 135 reaches a high level, closing the switches S1 and S2. The drive current $I_{dr}$ is the sum of the bias current $I_b$ (in the interval 422) and the mod current $I_m$ (in the interval 424). The mod current $I_m$ in the interval 424 is the result of the update of the error voltage $V_E$ at the previous negative-going transition.

During this time the input signal 135 is at the high level in the interval 430 causing the switches S1 and S2 closed in the interval 432. The reference current sources RBCS 220 and RMCS 225, the photodiode 140, and the transimpedance amplifier 160 continue their operation but their propagation through the analog comparator 250 is irrelevant for the bias counter 172 because the bias counter 172 is updated only at the positive-going transition of the input signal 135. However, the operation of the reference current sources RBCS 220 and RMCS 225, the photodiode 140 and the transimpedance amplifier 160 is relevant for the update of the mod counter 176. The error voltage $V_E$ is generated after the delay $\Delta_{Tm}$ in the interval 436. The delay ATM is caused by the combined delays from the reference current sources RBCS 220 and RMCS 225, the photodiode 140, the transimpedance amplifier 160, and the analog comparator COMP 250. After the delay DTm in the interval 436, the error voltage $V_E$ has the value of the modulating error voltage $V_{Em}$ and is valid in the interval 438. Again the delay ATM is sufficiently long enough to keep the modulating error voltage $V_{Em}$ valid before the negative-going transition of the input signal 135 to meet the set-up time of the mod counter 176. After the negative transition of the input signal 135, the mod counter 176 updates its count output and the current source DACM 125 produces an updated modulating current $I_m$ in the interval 442.

After the negative-going transition, the input signal 135 reaches its low level in the interval 450 causing the switches S1 and S2 open in the interval 452. The drive current $I_{dr}$ is equal to the bias current $I_b$ as generated by the current source DACB 120 in the interval 422 after a small delay $\Delta_{Tdr2}$. The process is then repeated.

As in the control circuit 102 in FIG. 1, the control circuit 202 uses synchronous updating of the two counters. By using the input signal 135 as the clock signal for the bias counter 172 and the mod counter 176, the control circuit 202 controls the laser drive circuit 101 at precisely controlled times. The updating of the counters is synchronized with the switching of the drive current with a finite delay. The control circuit 202 therefore generates proper control without using a separate clock generator circuitry for the clocking of the two counters. Furthermore, the control circuit 202 eliminates the use of two separate peak detectors.

In addition, the control circuit 202 eliminates two comparators in the control circuit 102 and instead uses two reference current sources at the photodiode side. The operation of the current sources is also synchronized with the switching of the drive current and the updating of the two counters. The result is a simple hardware structure with simple components.

Other modifications to the control circuit can be implemented. In the transimpedance amplifier, Schottky diodes in parallel with the feedback resistor R can be used to limit the output voltage swing. Alternatively, gain control circuit can be used instead of the simple Schottky diode limiting. The bias and the modulating up/down counters can be replaced by a digital circuit that uses a successive approximation algorithm to generate the control quantity. In addition, when the error quantity has been minimized, the current source DACB and DACM may toggle between two adjacent DAC codes. To prevent this toggling, additional logic circuitry can be included to stop the control function when the desired diode current levels have been reached.

Therefore, the present invention provides a technique to control an optical transmitter efficiently. The technique uses simple circuit design with less hardware than previous techniques, reducing fabrication costs and improving reliability. Two embodiments are disclosed. The first embodiment uses the input signal to synchronize the updating of the counters with the generation of the drive current. The second embodiment provides reference current sources at the monitor photodiode to form an input current to the transimpedance amplifier. The second embodiment uses the input signal to synchronize the input current having two separated components with the updating of the counters and the generation of the drive current.

As with other control circuits, the current adjustment can be done during the laser control interval defined by the Full Service Access Network (FSAN) specifications. By using this interval, the bandwidth requirements of the control circuit can be relaxed. To perform the adjustment during the laser control interval, an external synchronization signal (not shown) is used to enable the control circuit during the desired time interval.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for controlling a drive current of an optical transmitter having a laser, the method comprising:

generating a sensing signal responsive to an intensity of an optical radiation emitted by the laser using bias and modulating reference currents, the modulating reference current being generated synchronously with an input signal;

generating an error quantity in response to the sensing signal; and updating bias and modulating control quantities based on the error quantity synchronously with the input signal, the control quantity controlling the drive current.

2. The method of claim 1 wherein generating an error quantity comprising:

amplifying the sensing signal to produce an amplified quantity; and comparing the amplified quantity with a reference quantity to generate the error quantity.

3. The method of claim 2 wherein the error quantity is dependent on the bias and modulating reference currents.

4. The method of claim 3 wherein the control quantity includes a bias control quantity and a modulating control quantity.

5. The method of claim 4 wherein the drive current includes a bias current and a modulating current.

6. The method of claim 5 wherein updating a control quantity comprises:

updating a bias counter based on the bias error quantity to produce the bias control quantity, the bias control quantity controlling a bias current source to the produce the bias current; and updating a modulating counter based on the modulating error quantity to produce the modulating control quantity, the modulating control quantity controlling a modulating current source to the produce the modulating current.

7. The method of claim 6 wherein updating the bias counter is synchronized with a first state of the input signal and updating the modulating counter is synchronized with a second state of the input signal.

8. The method of claim 7 wherein comparing the amplified quantity comprising:

comparing the amplified quantity with a first reference quantity to produce the bias error quantity; and comparing the amplified quantity with a second reference quantity to produce the modulating error quantity.

9. The method of claim 7 wherein the sensing signal includes a first sensing signal and a second sensing signal.

10. The method of claim 9 wherein the sensing signal is generated synchronously with the input signal to produce the first sensing signal when the input signal is at the first state and the second sensing signal when the input signal is at the second state.

11. The method of claim 10 wherein:

the first sensing signal is produced by a photodiode current and the reference bias current, the reference bias current being generated by a reference bias current source, and the second sensing signal is produced by the photodiode current, the reference bias current, and the reference modulating current, the reference modulating current being generated by a reference modulating current source.

12. The method of claim 11 wherein the bias error quantity and the modulating error quantity are generated when the input signal is in the first and second states, respectively.

13. An apparatus for controlling a drive current of an optical transmitter having a laser, the apparatus comprising:

a sensing circuit to generate a sensing signal responsive to an intensity of an optical radiation emitted by the laser using bias and modulating reference currents, the modulating reference current being generated synchronously with an input signal;

an error circuit coupled to the sensing circuit to generate an error quantity in response to the sensing signal; and an updating circuit coupled to the error circuit to update bias and modulating control quantities based on the error quantity synchronously with the input signal, the control quantity controlling the drive current.

14. The apparatus of claim 13 wherein the error circuit comprises:

an amplifier coupled to the sensing circuit to amplify the sensing signal to produce an amplified quantity; and a comparator circuit coupled to the amplifier to compare the amplified quantity with a reference quantity to generate the error quantity.

15. The apparatus of claim 14 wherein the error quantity is dependent on the bias and modulating reference currents.

16. The apparatus of claim 15 wherein the control quantity includes a bias control quantity and a modulating control quantity.

17. The apparatus of claim 16 wherein the drive current includes a bias current and a modulating current.

18. The apparatus of claim 17 wherein the updating circuit comprises:

a bias counter coupled to the comparator circuit to produce the bias control quantity based on the bias error quantity;

a bias current source coupled to the bias counter to produce the bias current based on the bias control quantity;

a modulating counter coupled to the comparator circuit to produce the modulating control quantity based on the modulating error quantity; and a modulating current source coupled to the modulating counter to produce the modulating current based on the modulating control quantity.

19. The apparatus of claim 18 wherein the bias counter is updated synchronously with a first state of the input signal and the modulating counter is updated synchronously with a second state of the input signal.

20. The apparatus of claim 19 wherein the comparator circuit comprises:
   a bias comparator coupled to the amplifier to compare the amplified quantity with a first reference quantity to produce the bias error quantity; and
   a modulating comparator coupled to the amplifier to compare the amplified quantity with s second reference quantity to produce the modulating error quantity.

21. The apparatus of claim 14 wherein the sensing signal includes a first sensing signal and a second sensing signal.

22. The apparatus of claim 21 wherein the sensing signal is generated synchronously with the input signal to produce the first sensing signal when the input signal is at the first state and the second sensing signal when the input signal is at the second state.

23. The apparatus of claim 22 wherein:
   the first sensing signal is produced by a photodiode current and the reference bias current, the reference bias current being generated by a reference bias current source, and
   the second sensing signal is produced by the photodiode current, the reference bias current, and the reference modulating current, the reference modulating current being generated by a reference modulating current source.

24. The apparatus of claim 23 wherein the bias error quantity and the modulating error quantity are generated when the input signal is in the first and second states, respectively.

* * * * *